(12) United States Patent
Stoupis et al.

(10) Patent No.: US 11,121,537 B2
(45) Date of Patent: Sep. 14, 2021

(54) SYSTEM AND METHOD FOR LOCATING FAULTS AND COMMUNICATING NETWORK OPERATIONAL STATUS TO A UTILITY CREW USING AN INTELLIGENT FUSE

(71) Applicant: ABB Schweiz AG, Baden (CH)

(72) Inventors: James D. Stoupis, Raleigh, NC (US); Bernhard Deck, Weilheim (DE); Mirrasoul Mousavi, Cary, NC (US); Dmitry Ishchenko, Cary, NC (US)

(73) Assignee: ABB Schweiz AG, Baden (CH)

( * ) Notice: Subject to any disclaimer, the term of this patent is extended or adjusted under 35 U.S.C. 154(b) by 14 days.

(21) Appl. No.: 16/580,411

(22) Filed: Sep. 24, 2019

(65) Prior Publication Data

US 2020/0194991 A1 Jun. 18, 2020

Related U.S. Application Data

(63) Continuation of application No. 15/195,628, filed on Jun. 28, 2016, now Pat. No. 10,424,909, which is a
(Continued)

(51) Int. Cl.
*G01R 31/08* (2020.01)
*H02H 3/04* (2006.01)
(Continued)

(52) U.S. Cl.
CPC .......... *H02H 3/042* (2013.01); *G01R 31/086* (2013.01); *H01H 85/20* (2013.01); *H01H 85/46* (2013.01);
(Continued)

(58) Field of Classification Search
CPC ....... H02H 3/042; G01R 31/086; H01H 85/46
See application file for complete search history.

(56) References Cited

U.S. PATENT DOCUMENTS 5,168,414 A 12/1992 Horstmann
5,600,248 A * 2/1997 Westrom .............. G01R 31/088
324/522
(Continued)

FOREIGN PATENT DOCUMENTS

CN 101124705 2/2008
WO 2006031792 3/2006

OTHER PUBLICATIONS

The State Intellectual Property Office of the People's Republic of China, First Office Action for corresponding Chinese patent application No. 201480076590.4 dated May 4, 2018, 4 pgs.
(Continued)

*Primary Examiner* — Dominic E Hawkins
(74) *Attorney, Agent, or Firm* — Greenberg Traurig, LLP

(57) ABSTRACT

An intelligent fuse provides the operational status of the power network upon which the fuse is installed to a mobile device of a remote user. A fuse electronic circuit embedded in the fuse holder of the fuse captures the characteristic values of the power network and transmits the data to the mobile device. The mobile device has an application installed thereon to calculate the distance to fault location from the recording fuse using the fuse electronic circuit-captured data. The fuse electronic circuit-captured data is further used to visualize the data collected at the measurement points of the electrical system upon which the fuse is installed.

12 Claims, 7 Drawing Sheets

Related U.S. Application Data continuation of application No. PCT/US2014/069366, filed on Dec. 9, 2014.

(60) Provisional application No. 61/921,595, filed on Dec. 30, 2013.

(51) Int. Cl.
*H02H 1/00* (2006.01)
*H02H 7/26* (2006.01)
*H01H 85/20* (2006.01)
*H01H 85/46* (2006.01)

(52) U.S. Cl.
CPC ........ *H02H 1/0007* (2013.01); *H02H 1/0084* (2013.01); *H02H 7/263* (2013.01); *Y04S 10/52* (2013.01)

(56) References Cited

U.S. PATENT DOCUMENTS

| | | | |
|---|---|---|---|
| 8,046,625 B2 | 10/2011 | Bergman | |
| 9,203,276 B1 | 12/2015 | McCartney et al. | |
| 9,229,060 B1* | 1/2016 | Mahoney | G01R 31/58 |
| 2005/0024218 A1 | 2/2005 | Cuk | |
| 2005/0057227 A1 | 3/2005 | Rockwell | |
| 2006/0077607 A1* | 4/2006 | Henricks | H02J 13/00001 |
| | | | 361/93.1 |
| 2007/0002506 A1 | 1/2007 | Papallo et al. | |
| 2007/0257807 A1* | 11/2007 | Darr | H02H 3/042 |
| | | | 340/635 |
| 2008/0031520 A1 | 2/2008 | Hou | |
| 2009/0184796 A1* | 7/2009 | Heller | H01H 31/127 |
| | | | 337/168 |
| 2009/0289616 A1 | 11/2009 | Suouzzo et al. | |
| 2009/0289637 A1 | 11/2009 | Radtke | |
| 2010/0013496 A1 | 1/2010 | Goetz et al. | |
| 2010/0246080 A1* | 9/2010 | Nelson | H01H 85/20 |
| | | | 361/87 |
| 2011/0279985 A1* | 11/2011 | Horman | H03K 17/18 |
| | | | 361/748 |
| 2012/0004867 A1 | 1/2012 | Mousavi et al. | |
| 2013/0325402 A1 | 12/2013 | Vukojevic et al. | |
| 2014/0012520 A1 | 1/2014 | Zhao et al. | |

OTHER PUBLICATIONS

The State Intellectual Property Office of the People's Republic of China, English Translation of First Office Action for corresponding Chinese patent application No. 201480078590.4 dated May 4, 2018, 3 pgs.

International Search Report and Written Opinion, PCT Appln. No. PCT/US2014/069366 dated Feb. 26, 2015, 9 pgs.

S. Mohagheghi et al, Modeling Distribution Automation System Components Using IEC 01, Jan. 2009, 6 pgs.

* cited by examiner

SYSTEM AND METHOD FOR LOCATING FAULTS AND COMMUNICATING NETWORK OPERATIONAL STATUS TO A UTILITY CREW USING AN INTELLIGENT FUSE

FIELD OF INVENTION

The present application is directed to a fuse for protecting a power distribution feeder that is operable to isolate the portion of the power network experiencing a fault, determine fault location, and communicate the fault location and general power network operational status to a utility crew or control center.

BACKGROUND

Electrical power distribution networks often span a long distance and are subject to faults along the distribution lines due to human, animal or, weather-related interactions. The fault location must be detected as quickly as possible to restore normal operation of the power distribution network.

Fuses are often used to protect the distribution lines and the equipment installed thereon from fault events. Conventional fuses have an internal component that melts when exposed to sustained overcurrent above the fuse rating. Known fuses are not capable of providing an operational status to the utility crew that maintains the power system. Additionally, faults located downstream from the fuse are not communicated to the utility crew by conventional fuses.

This means that the utility crew must manually locate the blown or failed fuse which is a time-consuming task. The utility crew can typically find the fuse that operated by visual inspection, but cannot pinpoint the exact fault location or faulted segment as it may be anywhere downstream of the fuse that operated. Often times, the utility crew uses an iterative bifurcation technique to identify the faulted segment.

The iterative technique involves dividing the faulted lateral downstream from the blown fuse in two segments by opening the tie switch between the two segments, replacement of the failed fuse, reconnection to the circuit, and verification of fault clearance. If the fault is still present, the technique must be repeated on the first segment until the faulted segment is identified. If the fault has cleared, the process repeats on the second segment until the faulted segment is identified. Thus, there is a need in the art for an improved fuse for protecting electrical networks and fault location.

BRIEF DESCRIPTION OF THE DRAWINGS

In the accompanying drawings, structural embodiments are illustrated that, together with the detailed description provided below, describe exemplary embodiments of a fuse capable of communicating operational status of the fuse and the electrical network upon which the fuse is installed. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
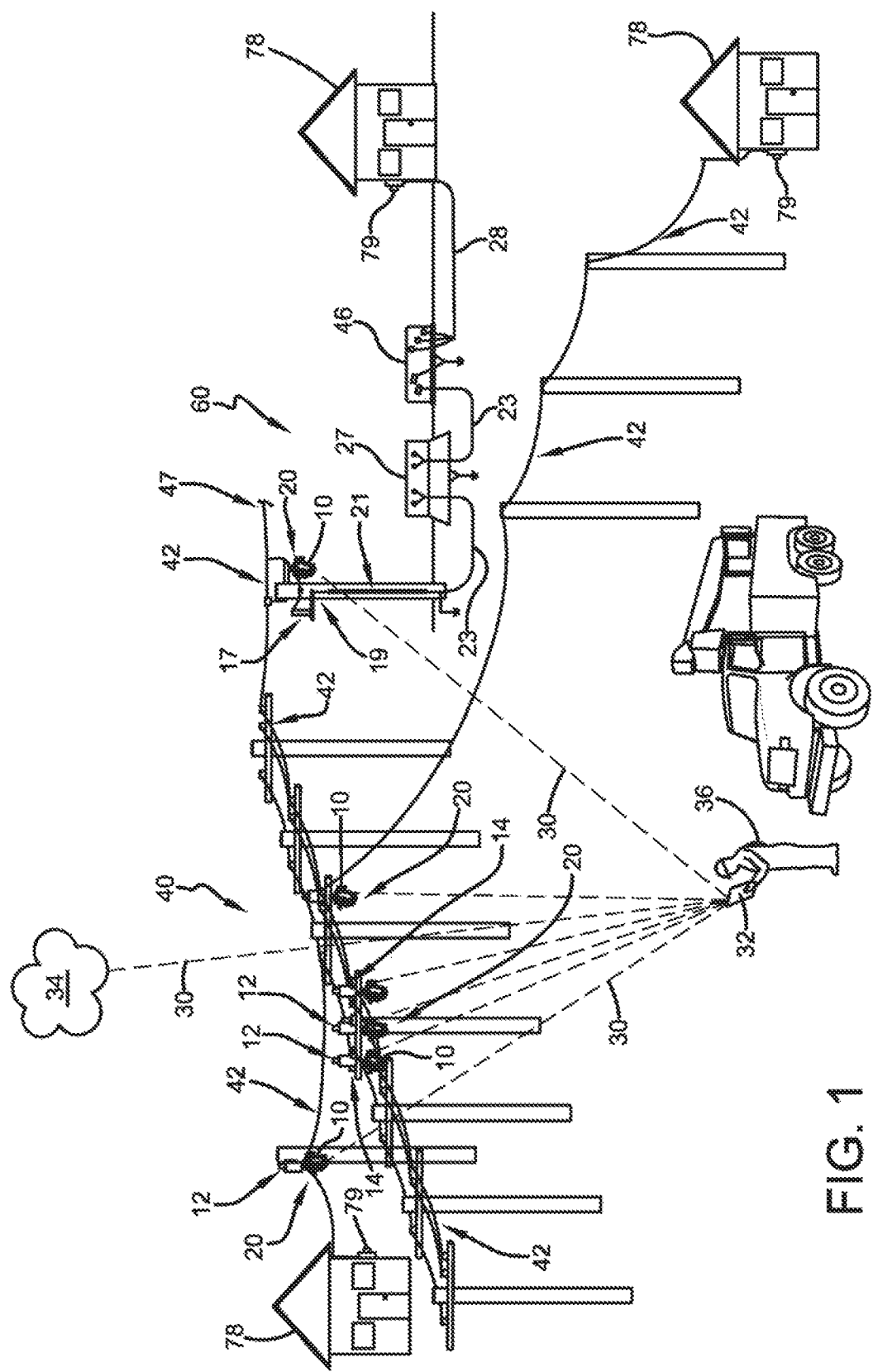
FIG. 1 is a schematic of exemplary overhead and underground power distribution networks having fuses installed thereon that communicate physical quantities such as current and voltage values to mobile devices of utility crew or a gateway device.

With reference to FIG. 1, an exemplary medium-voltage overhead and underground electrical power distribution network 40, 60 carrying electricity in a voltage range of from about 5 kv to about 38 kv is shown having cutouts 20 installed thereon to protect the power network 40. The fuse cutouts 20 have a fuse holder 22 and fuse 10. It should be understood that the fuse cutouts 20 and fuse 10, embodied in accordance with the present disclosure, may also be utilized in a high- or a low-voltage power distribution network.

The overhead power distribution network 40 has fuse cutouts 20 installed to protect laterals, segments 65 and loads 78. The fuse 10 inside the fuse cutout 20 is an intelligent fuse 10, operable to receive, interpret, and communicate characteristic values such as current, voltage, temperature of the conductor 42, weather conditions such as humidity, and temperature of the surrounding environment at the fuse 10 location. The fuse 10 is operable to receive historical characteristic values stored at the fuse 10 location on an EPROM, EEPROM or similar memory storage, as will be described in more detail below or from a database at the utility network control center (NCC).

With continued reference to FIG. 1, the overhead power distribution network 40 transitions to an underground power distribution network 60 along a riser pole 19. The overhead network cable 40 is connected to the underground circuit 60 through the cutout 20. The cutout 20 is operable to disconnect the underground circuit 60 from the overhead circuit 40 in the event of a fault on the underground circuit 60. The fuse 10 protecting the underground circuit records and processes the characteristic values using an electronic circuit 16 and transmits the processed characteristic values to the mobile device 32. The mobile device 32 has an application installed thereon which uses the characteristic values to calculate the distance to the fault from the fuse 10 location in a fault event. The distance to fault location calculation provides the utility crew with a fault location estimate so that the crew knows where to dig to access the underground cable experiencing the fault or perform maintenance.

The riser pole cable 21 and equipment 27, 46 is protected by a surge arrester 17. The rise pole cable 21 runs the length of the riser pole 19 until the cable 21 reaches ground level and is then buried underground. The underground cable 23 is connected to a pad-mounted switchgear cabinet 27 through cable terminations. The underground cable 23 further connects the switchgear 27 to a pad-mounted transformer 46 to step down the current and voltage values to a level usable by the load 78.

The fuse cutouts 20 protect the overhead and underground laterals 40, 60 from potential faults and notify mobile devices 32 and gateway devices at a substation or mounted on utility poles of the location of fault events on the power distribution network 40, 60. The fuses 10 are operable to communicate fuse status and power distribution network operating characteristic values to mobile devices and computers at the NCC. The fuses 10 receive characteristic value signals such as current and voltage from sensors 12 installed on the power distribution network 40 or embedded in the fuse 10 assembly, interpret the signals, and transmit the power network operating characteristics to mobile devices 32. Alternatively, the fuses 10 may transmit the characteristic values to field devices, SCADA systems, computers located at the NCC or a data repository on the cloud 34.

Temperature sensors may be embedded into the fuse 10 to measure and monitor for conductor 42 thermal overload conditions. A weather station having several weather sensors may be installed near the fuse 10 location to monitor weather conditions such as wind speed to determine whether conductors 42 are touching, humidity and other conditions. The weather station may receive local weather information to that activates a camera or video recorder to capture photos or video during storm conditions, showing downed conductors or poles, when predetermined weather conditions exist.

With continued reference to FIG. 1, the utility crew 36 arrives at a work site and with a mobile device 32 executes a computer application (ie. "mobile application," "mobile app," "computer app" or "app") that receives communications 30 and data from the fuses 10 on the power network 40, 60. The mobile devices 32 are smartphones, tablet computers, hand-held computers, RFID tag readers, or any other device capable of receiving data from a wireless, wired, short-range, or long-range communications medium 30 for display to a user. The mobile devices 32 have a computer-readable medium and a processor for executing the computer-readable instructions of the computer application installed thereon.

With continued reference to FIG. 1, the fuse 10 of the present disclosure is operable to identify the location of the fault and notify utility crew, even when the fault occurs on a power distribution network spanning a relatively long distance and having multiple segments 65. The overhead power distribution network 40 has sensors 12 mounted or installed upon elongated conductors 42 of a three-phase power system. The sensors 12 step down higher voltage and current values to lower, usable values for meters, relays, and other measuring and protection devices 58 installed on the overhead power distribution network 40. The sensors 12 further measure the characteristic values of the elongated conductor 42 such as current, voltage, conductor temperature and characteristic values of the surrounding environment in which the conductor is located such as ambient temperature and humidity.

In one embodiment, a current sensor is embedded in a fuse holder 22 of the fuse 10 to measure current values through the fuse 10. It should be understood that whether the characteristic values are measured across/through the fuse using an embedded sensor or an instrument transformer in close proximity to the fuse, the measurements taken at the fuse 10 location as a measurement point increase the measurement accuracy and eliminate uncertainties associated with conductor line modeling and branched lines.

Alternatively, the sensor 12 may be embodied as an instrument transformer having a combination voltage and current sensor having a primary side of the current sensor clamped to a conductor 42 of a power distribution network feeder 40, 60 for measuring characteristic values of the conductor 42. The voltage sensor supplies power to the fuse 10 and the corresponding electronic circuit 16 embedded in the assembly of the fuse 10. The instrument transformer is rated at from about 4 to about 20 mA and provides analog output measurements. Further, the instrument transformer is in a metering class of from about 5 kV to about 13.8 kV.

The secondary side of the instrument transformer outputs stepped down current and voltage values and measurements. The secondary or low-voltage side of the voltage transformer also provides power to the corresponding fuse 10, rendering the fuse 10 a self-powered device. Alternatively, the fuse 10 is powered using stored energy from a solar energy storage receptacle located on the power distribution network or a standard battery. The fuse 10 may operate using the stored solar energy for about twenty-four hours. In one embodiment, the fuse 10 electronic circuit 16 has a supercapacitor or a small battery that provides power to the fuse 10 on a short-term basis, allowing the fuse to be self-powered when primary power is not available due to the presence of a fault condition and fuse 10 interruption of the circuit. The power requirement may be as little as a few seconds to send a last-gasp "power out" message or as many as few hours of stored or battery power until the primary power is restored.

Additionally, the electronic circuit 16 has short range communication capabilities, including but not limited to wake-on Bluetooth capability that is activated upon the detection of communications to the fuse 10. It should be understood that other short range communication media are contemplated by the inventors and not limited to the above mentioned examples.

Figure 2:
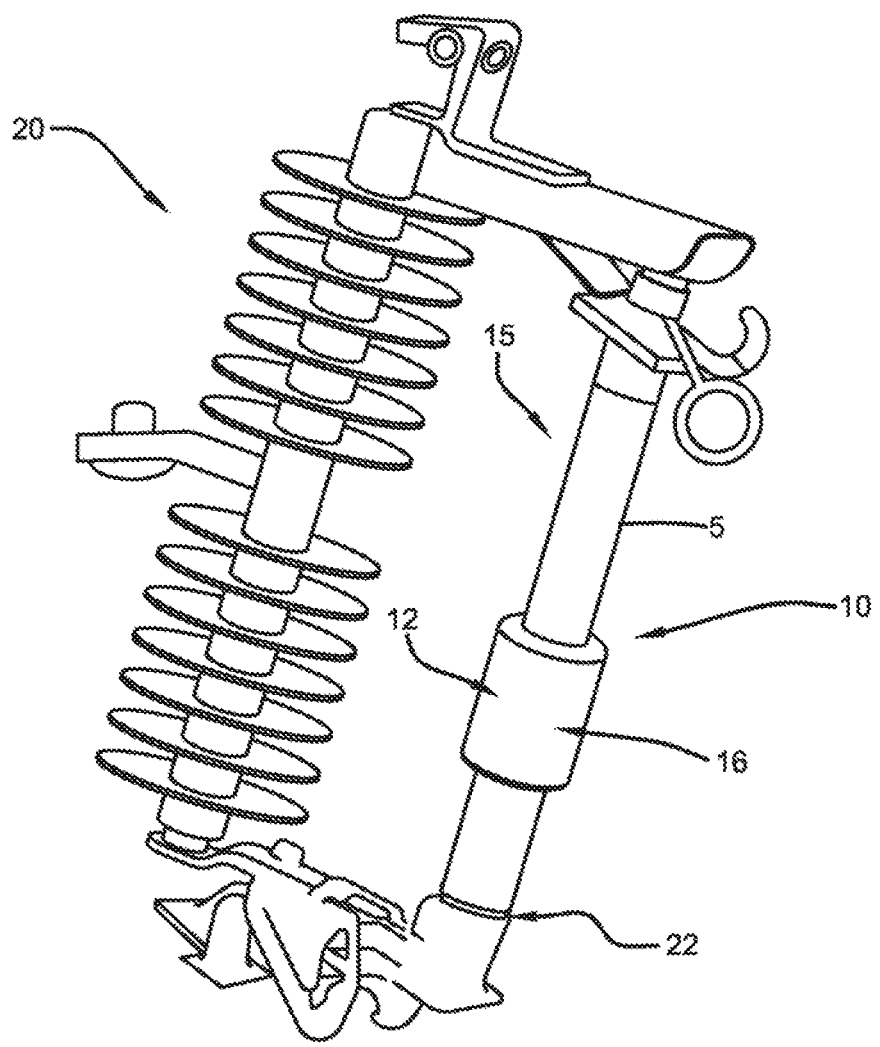
FIG. 2 shows the fuse installed in an exemplary cutout application.

Characteristic values measured by the sensors 12 are output to a terminal 14 of the sensor 12 and the characteristic values are transmitted by a hard-wired connection or wirelessly to the fuse 10 electronic circuit 16. The fuse 10 electronic circuit 16, as depicted in FIG. 2, receives and interprets the current and voltage signals from the sensors 12. The fuse electronic circuit 16 converts the signals into characteristic values usable or storable by the mobile devices 32 or power distribution feeder management system 80.

Alternatively, the voltage sensor is external to the fuse 10 and is mounted upon the elongated conductor 42 and the current sensor 12 is embedded in the fuse holder 22. In this arrangement, the fuse 10 electronic circuit 16 receives current signals directly and the voltage sensor 12 outputs voltage signals to the terminal 14 for transmission to the fuse 10 electronic circuit 16. The fuse electronic circuit 16 then converts the voltage and current signals representative of the characteristic values of the measurement point to output data that is further transmitted to receivers such as the mobile devices 32 or power distribution network feeder management system 80. The fuse holder-embedded current sensor may be embodied as a printed circuit board-based Rogowski coil. The external voltage sensor may be embodied as a Hall-effect voltage-measuring sensor.

The fuse 10 electronic circuit 16 then transmits the electronic circuit-interpreted data via a bi-directional communications medium 30 such as Bluetooth, WiFi, WiMAX, ZigBee or any other applicable network communications standard. Alternatively, a communications medium 30 such as a cellular network, fiber optic line, Powerline Carrier (PLC), or serial wired connection may be utilized. The communications medium supports short-range and/or long-range communications depending on the application.

The electronic circuit-interpreted data is transmitted to the utility crew's mobile device(s) through short-range wireless. In one embodiment, an indirect communication via cellular link is used to communicate the electronic circuit-captured data to the utility NCC and at the same time, the cellular link updates the utility crew's mobile device(s) with characteristic values, timestamps, and other captured data from each fuse 10 location on the distribution network being monitored. In one embodiment, the fuse electronic circuit-captured data is transmitted to the cloud 34, a database of a computer 58 in the NCC, field devices, field controllers, SCADA systems, or any distribution feeder management system 80 that has a database 82.

With reference now to FIG. 2, the exemplary cutout 20 embodiment utilizing the fuse 10 is depicted in more detail. The cutout 20 has the fuse 10, a fuse holder 22, and embedded electronic circuit 16. It should be understood that the fuse 10 may be utilized with reclosers, relays, circuit breaker, switchgear, or as a standalone fuse 10 having an embedded electronic circuit 16 and that the fuse cut-out 20 is presented by way of non-limiting example.

With continued reference to FIG. 2, the fuse 10 has a fuse element 5 mounted in or otherwise connected to the fuse holder 22. The fuse holder 22 is compatible with standard fuse elements or may be retrofit to house non-standard fuse elements. The fuse holder 22 is used to seat the fuse element 5 and has a clamp (not shown) to engage with and/or retain the fuse element 5. When the fuse element 5 fails due to detected overcurrent, the arm 15 of the cutout 10 swings outward, opening the circuit, and providing a visible indication of the failure of the fuse element 5.

Upon failure of the existing fuse element 5, the utility crew 36 replaces the blown fuse element 5 with a new fuse element 5. Alternatively, the fuse element 5 includes a set of backup fuse elements that are designed to automatically replace the blown fuse element 5. One example of such a fuse element 5 is a cartridge that contains several replacement fuse links and automatically switches to a new fuse link when the existing fuse element blows or fails.

Another alternative is a fuse 10 installed near and operating in conjunction with a recloser. The recloser opens the circuit during a temporary fault event. After one trip, the temporary fault is typically cleared. The fuse 10 electronic circuit 16 records characteristic values before and after the fault. The fuse 10 is able to reset itself with a new fuse link should overcurrent above the fuse rating occur.

While the blown fuse may be visually detected and replaced by the utility crew 36, the exact location of the fault or the faulted segment 65 that caused the fuse 10 to blow may not be apparent. Therefore, more information is required to determine the location of the fault. One method of capturing data leading to a fault location determination is determining power network operational status at the fuse 10 location.

As previously mentioned, the fuse holder 22 embedded electronic circuit 16 captures characteristic values at the measurement point. Voltage and current signal data is captured by the electronic circuit 16 and transmitted through the communications medium 30 to the mobile device. The mobile device has an application installed thereon to generate voltage and current waveforms as will be described in more detail below.

The fuse 10 is operable to communicate the identification and location data of the fuse 10 to mobile devices 32 of utility crew 36. A GPS unit (not shown) is installed at the location of the fuse 10 and provides location coordinates and corresponding timestamps for all data recorded including but not limited to current, voltage, temperature, humidity, video recordings, and camera-generated images. Historical data regarding network and weather conditions such as temperature and humidity is stored in the power distribution network management database 82 and available to the mobile devices 32 through the communications medium 30.

The fuse 10 location data along with the identification number of the fuse 10 enables the utility crew 36 to locate the fuse 10 on the power network 40, 60. The fuse 10 location and identification number (ID number) are sent via the communications medium 30 to mobile devices 32 of a utility crew 36. The fuse 10 is capable of storing data captured by the electronic circuit 16 to a flash memory such as an EEPROM or EPROM, for storage until the utility crew 36 arrive at the fault location and are within range to transfer the captured data into mobile devices 32.

In one embodiment, the sensors, electronic circuit and radio communications are embedded into the fuse assembly as an integrated circuit. The integrated circuit allows the electronic circuits of fuses 10 to communicate with the NCC 88, substation computers 80, and electronic circuits of other fuses 10 using low-power wireless data routing protocols such as WiFi, Bluetooth or ZigBee using the IEEE 802.15.4 standard as well any other standard supporting low-power, short-range wireless transmission.

Figure 3:
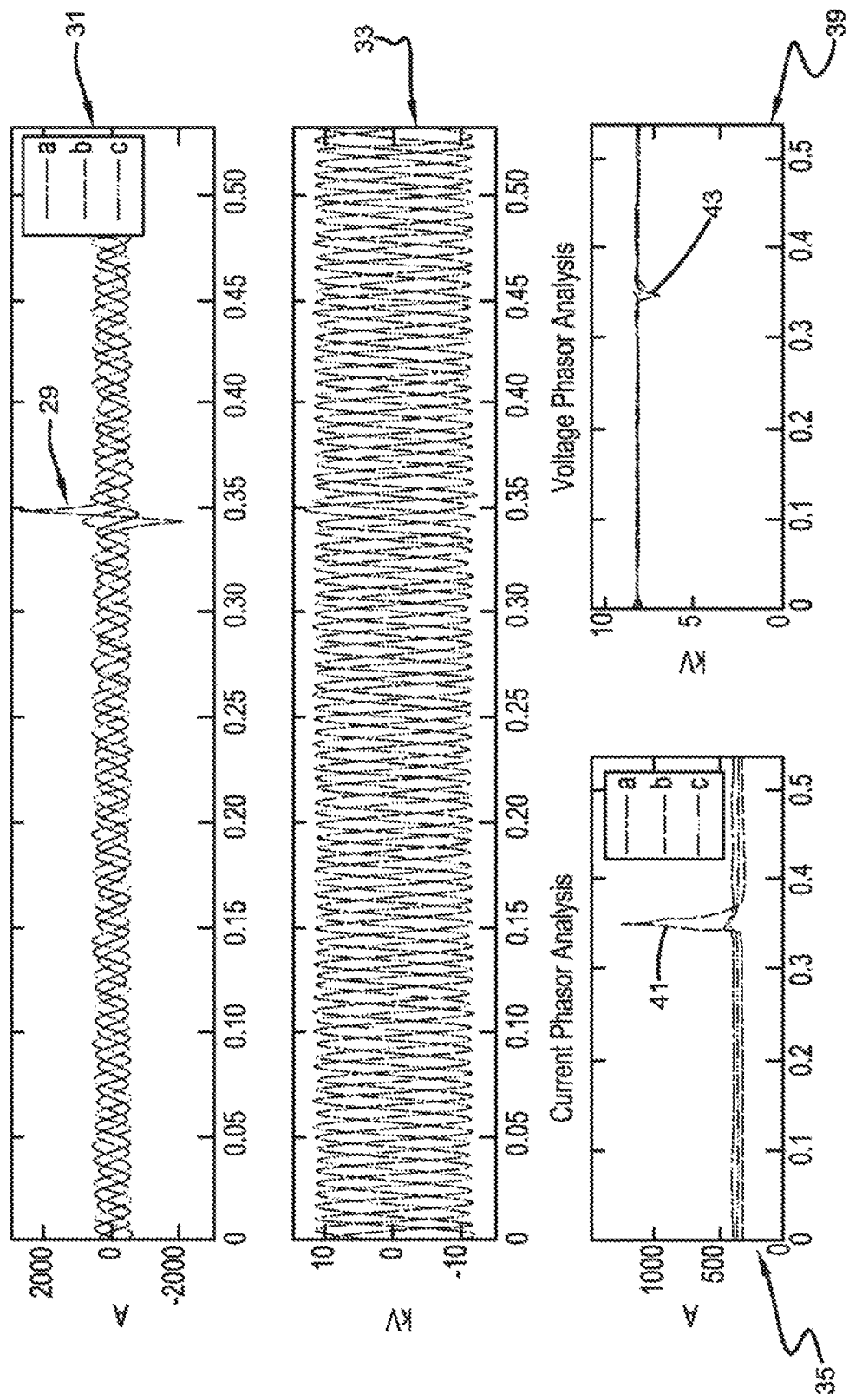
FIG. 3 depicts an exemplary waveform profile that is generated by a mobile application from data captured by electronic circuits of the fuses separately installed upon corresponding phases a, b, and c of the power distribution network.

With reference now to FIG. 3, waveform and phasor analysis profiles 31, 33, 35, 39 are generated by the mobile application using the measured characteristic values at the various fuse 10 locations. The utility crew uses the mobile application to display the waveform profiles for the selected fuse 10 on the mobile device 32. The waveform and phasor profiles 31, 33, 35 39 provide the utility crew 36 with a visual indication of the network 40, 60 operational status at the fuse 10 location or measurement point of interest.

Further, the mobile device 32 processor executes computer-readable instructions to generate current and voltage waveform graphs on the mobile device 32, as depicted in FIG. 3. Alternatively, the current and voltage waveform profiles 31, 33 may be provided on a display installed with the fuse 10 or integrated into the fuse holder 22. The utility crew use the current and voltage waveform charts to determine locations on the network that are operating near or outside of predetermined thresholds. In this manner, the utility crew may prevent a fault from occurring by analyzing the voltage and current waveform data and maintaining pre-fault sections of the power network.

The current waveform profile 31 shows current in Amps versus time in seconds for a three-phase system (phases a, b, and c). It is evident from the current waveform profile 31 that phase b is experiencing a current spike 29 at around 0.35 seconds of the current measurement at the location of the reporting fuse 10 or current sensor. It should be understood that the above example is for individual fuses 10 installed upon corresponding phases of the phases a, b, and c and that in other installations the current and voltage waveform profiles 31, 33 may depict only the individual fuse 10 installed upon the corresponding single phase a, b, or c or two of the three phases. Typical installations have single-phase or double-phase laterals 40, 60.

A voltage waveform profile 33 for the same time period as the current waveform profile 31 is shown in kilovolts versus time in seconds. There is a voltage dip in phase b at around 0.35 seconds of the voltage measurement at the location of the reporting fuse 10 or voltage sensor.

A current phasor analysis 35 chart is determined from the current values measured at the fuse measurement point in a known manner. The exemplary current phasor plot displayed on the mobile device has a spike 41 in phase b at around 0.35 seconds. A voltage phasor analysis chart is determined using the voltage values measured at the fuse location in a known manner. The exemplary voltage phasor chart is depicted as experiencing a dip 43 in phase b at around 0.35 seconds.

Figure 4:
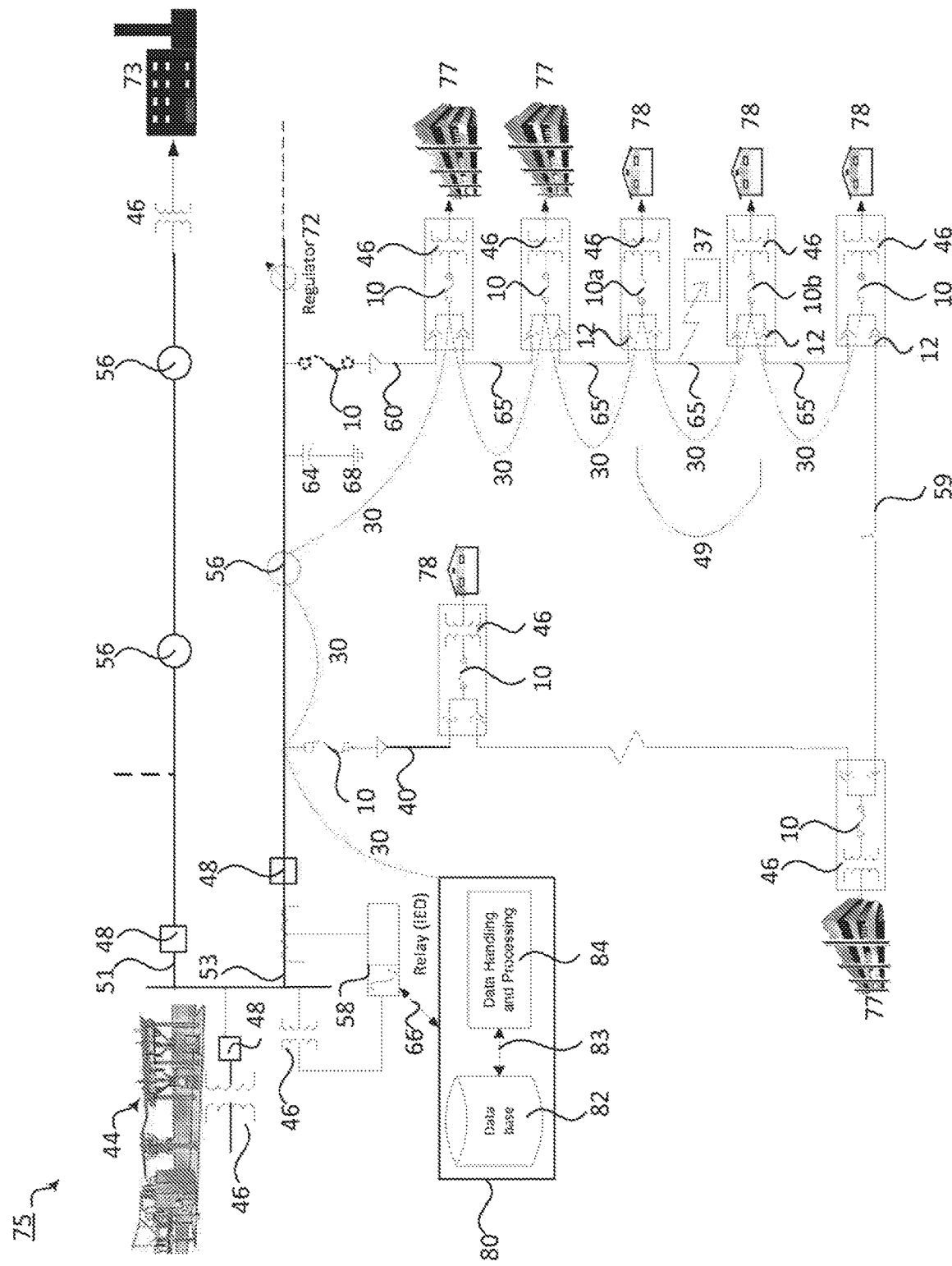
FIG. 4 is a network model of the exemplary power network having overhead and underground circuits that are monitored and protected by fuses embodied in accordance with the present disclosure and a fault location superposed thereon.

With reference now to FIG. 4, an exemplary network model 70 of a power distribution system is depicted. The power network model 70 is a logical representation of the relationships between equipment on the power network, events on the power network and the control settings for the operation of equipment on the power network. The power network model 70 is maintained by the distribution substation or NCC responsible for the power network or a plurality of substations. The power network model 70 may represent the entire power distribution network or sections of interest of the power network. The power network model may include GIS data that is a spatial representation of the power distribution network.

The network model 70 is downloaded on demand or periodically updated on the mobile device 32 by the utility crew 36. The computer application 110 installed on the user's mobile device 32 reads the network model 70 and then retrieves the characteristic values from the electronic circuits 16 of each of the fuses 10 on the network model 70. A map 130 is created by the application on the user's mobile device 32, depicting the operational status of power network 40, 60 by superposing fault locations 37 or pinpointing locations on the network model 70 that have measured oscillatory values outside of predetermined thresholds. FIG. 4 is an example of a network model having a fault location 37 designated thereon and will be described in more detail below.

In the exemplary power network model shown in FIG. 4, there is a substation 44 and plurality of feeders 51 enclosed in broken lines. The distribution feeder cables 51, 53 are output from the distribution substation 44. Installed in the substation 44 are transformers 46, circuit protection devices such as fuses 10 and circuit breakers 48, and intelligent electronic devices (IEDs) that include but are not limited to relays 58 that control the operation of associated equipment.

Data captured by the IED 58 at the substation 44 is transmitted through a communications medium 66 to a database 82. The database 82 may reside on a feeder management system, NCC server, or SCADA. Data received from the network of fuses 10, IEDs 58 and other devices having data communication capabilities is aggregated by a data handling and processing module 84 before the data is stored in the database 82. The data handling and processing module 84 is operable to convert various forms of data into a common format or structure for storing in the database 82.

A first feeder cable 51 output from the substation 44 supplies electricity to an industrial load 73. A second feeder cable 53 output from the substation 44 supplies electricity to overhead and underground branches 40, 60 of the secondary power distribution network 45 and corresponding loads 77. The overhead and underground power networks 40, 60 and corresponding single-phase and three-phase loads 73, 77, 78 are protected by fuses 10, circuit breakers 48, and reclosers 56. The overhead and underground power networks 40, 60 may be connected by a tie breaker 59 in a fault event where it is necessary for the overhead circuit 40 to provide backup power to the underground circuit 60 or vice versa. In the overhead power network 40, the normally open point in the loop is typically an automated switch.

Fuses 10 are connected at locations where the overhead 40 and underground 60 laterals connect to the second feeder 53. The overhead circuit 40 of the secondary distribution network 45 has two load types 77, 78, and each of the loads 77 is protected by a corresponding fuse 10. All fuses 10 may be intelligent and record and transmit characteristic values of the respective circuit to which they are connected to the mobile devices 32 or databases 82 upon the occurrence of a fault 37 or at predetermined daily intervals in the presence or absence of a fault event. It should be understood that other intervals such as time intervals occurring every other day may be set by a user for collection of characteristic values of the conductor 42 and surrounding environment.

The underground power network 60 provides electricity to multiple loads 77, 78 through an underground cable. An exemplary fault 37 is present on the underground circuit 60 located upstream of fuse 10a. It should be understood that all of the fuses 10, 10a, 10b of the present disclosure are equivalent in structure and function, but have designations such as 10a to pinpoint the fuse 10 that operated and 10b to describe the operation of fuses 10 that protect the loads 75, 78 directly.

It should be understood that any fuse 10 located upstream of a fault 37 on the feeder network, such as fuse 10a, is operable to provide enough information to calculate distance to a fault location as well as waveform profiles for each fuse 10 location and any corresponding fault location. The faulted location or segment 65 may be inferred from status information communicated from any of the fuses 10. One exception is that fuses such as 10b are installed to protect the respective load 75, 78 and transformer, so it should be understood that fuse 10b provides status for that portion of the network corresponding to the load 75, 78.

In a scenario wherein the fuse 10a has blown or otherwise failed due to fault 37 a distance 49 downstream, the fuse 10a transmits location data and a normal operational status to the mobile device 32 using battery backup. The current and voltage values are further transmitted from the fuse 10a to the mobile device 32 or the database 82.

The fuse 10a, and any other intelligent fuse 10 located upstream from the fault 37 senses the fault 37, senses the fault 37. In one embodiment, the detection of the fault 37 by fuse 10a operating in a response to current above the fuse rating, also triggers the electronic circuit 16 to interrogate and receive the characteristic values from the corresponding sensor 12. Location tagging of the operated fuse 10a is captured by a GPS unit (not shown) installed at the location of the fuse 10 that operated, in this case fuse 10a, and the coordinates are transmitted to the fuse 10a electronic circuit 16.

There are multiple triggering and scheduling methods for the fuse electronic circuit 16 to transmit the interpreted data to the mobile device 32. A first method for triggering the transmission of data from the fuse electronic circuit 16 to the mobile device 32 is by utility crew requesting the operational status of the fuse 10 and/or network upon which the fuse 10 is installed via the computer application. The first method requires the utility crew's mobile devices 32 to be located within a predetermined range of the fuse electronic circuit 16 communications if the communications medium 30 is short-range. The usage of a long-range communications medium 30 may allow for the mobile devices 32 to be located farther away from the fault location or site of interest.

A second method for triggering the transmission of data from the fuse electronic circuit 16 to the mobile device 32 is that the fault 37 which triggers the operation of the fuse 10, concurrently triggers the fuse electronic circuit 16 to record current and voltage data for later transmission to a database 82 of the distribution feeder management system 80 or mobile device 32. Fuses 10 located upstream of the faulted fuse 10b record current and signal values transmitted by other operational fuses 10 on the feeder branch circuit 40, 60.

A third method for triggering the transmission of data from the fuse electronic circuit 16 to the mobile device 32 is on a scheduled basis. The mobile devices 32 receive current and voltage data from the fuses 10 on a scheduled basis such as hourly or daily at a designated time or any other time desired frame. The schedule for receiving current and voltage data may be set in the mobile device 32 or power distribution network feeder management system 80.

A fourth method for triggering the transmission of data from the fuse electronic circuit 16 to the mobile device 32, is interrogation by mobile device 32 or any other device operable to communicate with the fuses 10 to provide real-time operational status or real-time status of the network circuit upon which the respective fuses 10 are installed. The fuses in response to the interrogation by other devices, transmit current and voltage data to the requesting device.

The fuse 10 electronic circuit 16 transmits voltage, current and fuse location data to mobile devices 32, database 82, or to a flash drive for later transmission to the mobile devices 32. It should be understood that the flash drive or another type of EPROM (erasable programmable read-only memory) or EEPROM (electrically erasable programmable read-only memory) may be used for storing the voltage and current data for later wireless or wired transmission to mobile devices 32, SCADA systems, NCC servers, feeder management systems, or a data repository on the cloud 34.

The mobile device 32 receives the voltage, current and fuse location data and integrates the data with the network model 70 to pinpoint the location of fault events occurring on the power network. In this manner, fault 37, located downstream of the fuse 10a is depicted on the mobile device 32 at the estimated location. The mobile device 32 application executes computer-readable instructions to calculate estimated fault locations and plot those fault locations 37 on the applicable network model 75 as will be described in more detail below.

When responding to the fault 30, the utility crew download the network model from the NCC, substation automation computer, or another database of a system that is in communication with the power network of interest. Alternatively, updates can be pushed on a scheduled basis to the mobile devices 32 of utility crew based on their location and proximity to the power network of interest.

Figure 5:
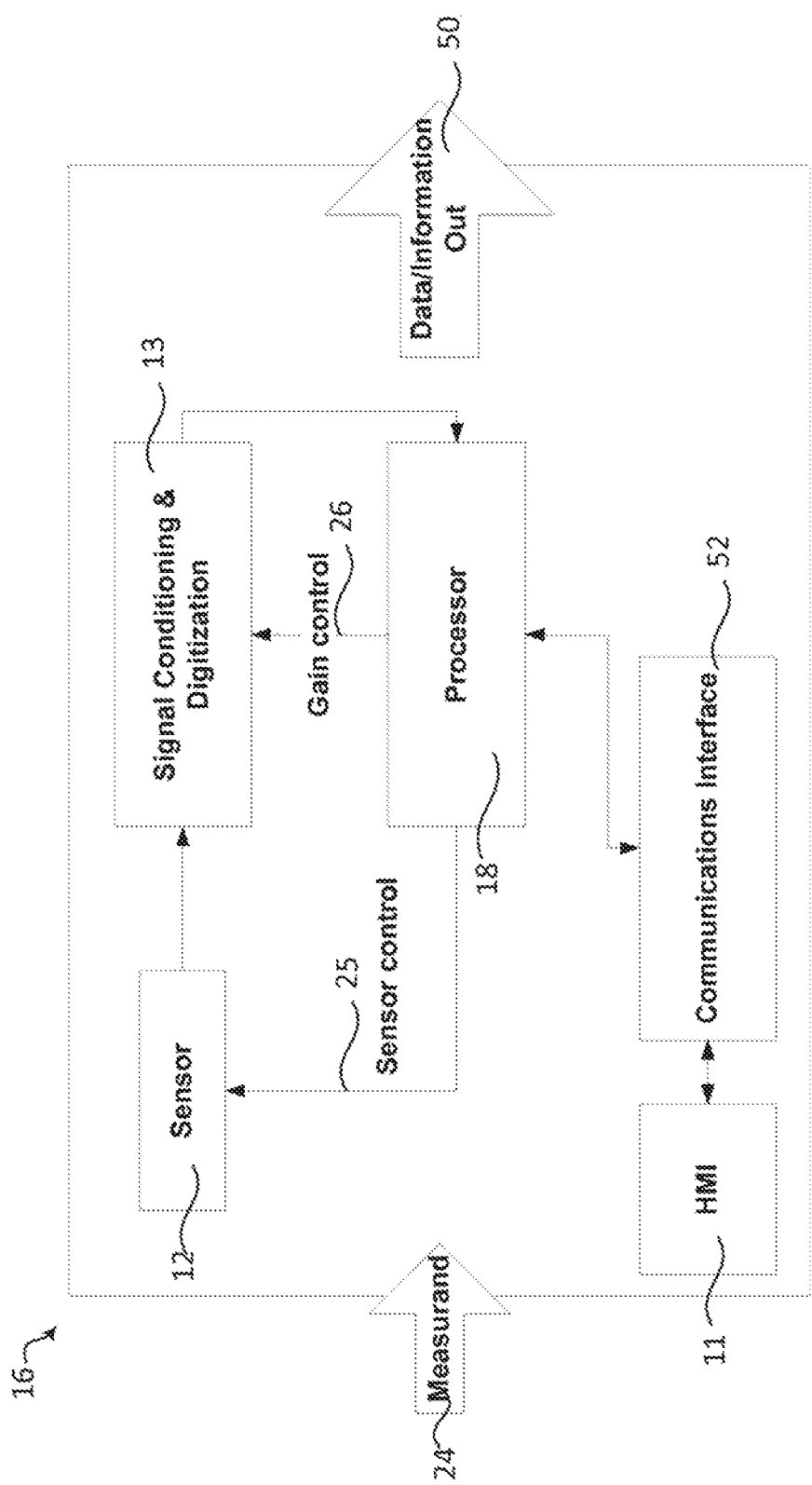
FIG. 5 is a block diagram of the fuse electronic circuit.

With reference now to FIG. 5, a block diagram of the electronic circuit is depicted. The electronic circuit has a sensor 12, signal conditioning and digitization unit 13, a processor 18 and a communications interface 52. The sensor 12 measures and receives input measurand(s) 24 such as the characteristic values and signals, and may be integral to the electronic circuit 16 or external as mentioned above in regards to external instrument transformers. The signal conditioning and digitization unit 13 is operable to amplify the signal, provide digital output, and store the conditioned and digitized signals as raw data.

The processor 18 is a microprocessor programmed to carry out data processing and analysis, an integrated circuit, or multiple integrated circuits. The processor 18 provides output data 50 which may be value-added data to a local or remote communications interface and further to the mobile device 32. The processor 18 uses the average or peak output signal level of the measurand(s) 24 to adjust the gain 26 to a suitable level, enabling the electronic circuit 16 to work with a broader range of input signal levels. The processor 18 also provides sensor control 25.

As previously described, the components of the electronic circuit 16 are integrated into the fuse 10 or alternatively an IED. The fuse 10 or other IED has a human machine interface (HMI) 11. Alternatively, the HMI 11 is in communication with the electronic circuit 16 at a remote location, such as the substation computer 80.

Figure 6:
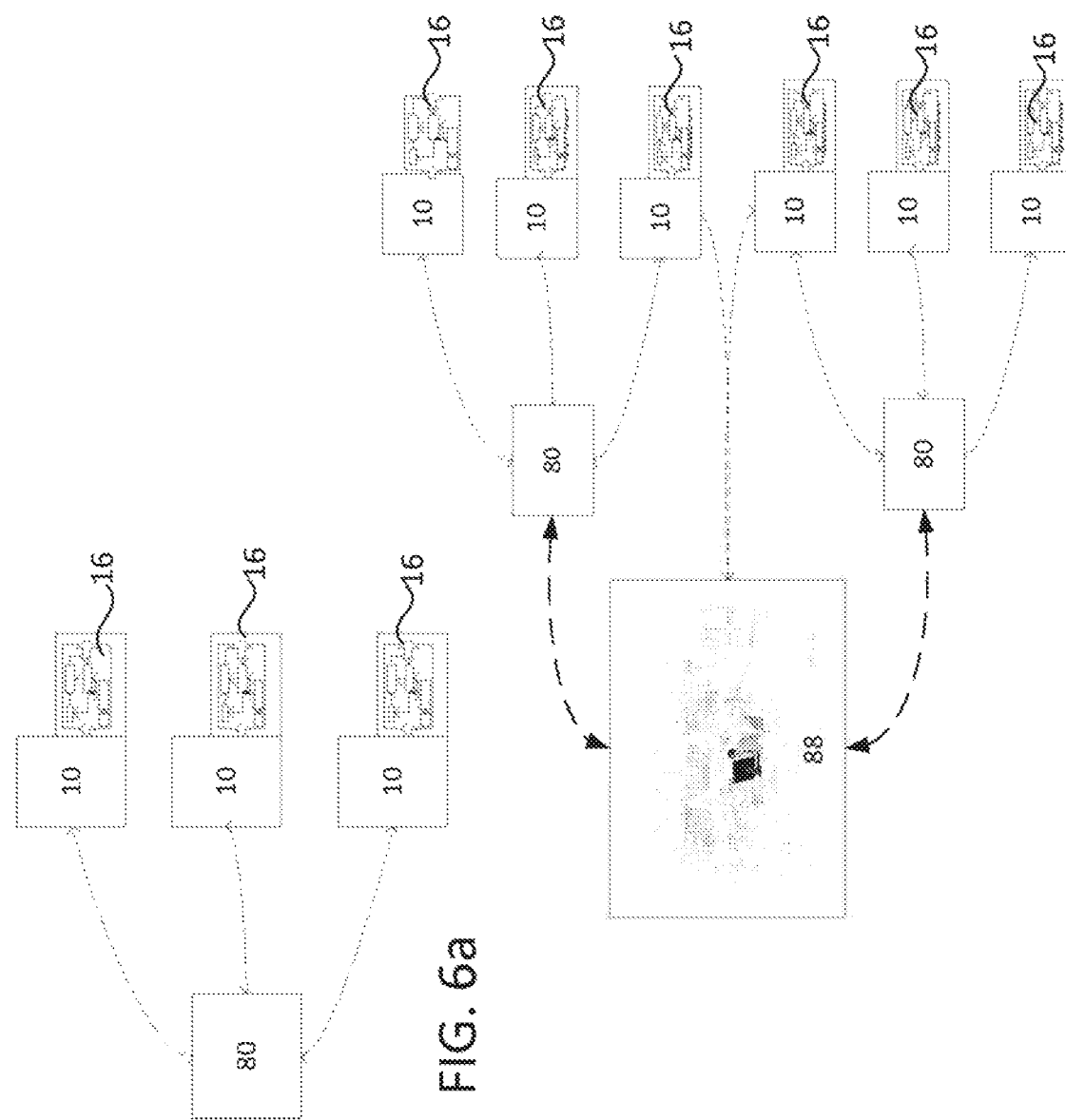
FIG. 6a is a diagram of a hierarchical network of fuses having electronic circuits that communicate data to substation computers and/or network control center.
FIG. 6b is a diagram of a meshed network of fuses having electronic circuits that communicate data to substation computers and/or network control center.

With reference now to FIGS. 6a and 6b, the communications network 30 may be embodied as a network of fuses 10 having electronic circuits 16 that are connected to each other through a gateway or through peer-to-peer connections forming a hierarchical network topology as depicted in FIG. 6a or a meshed network topology as depicted in FIG. 6b. The data is collected at each network node, optionally pre-processed and forwarded to the NCC 88 directly or through other network nodes. The collected data may be communicated to the distribution feeder management system 80 or NCC 88 through a gateway connection.

Figure 7:
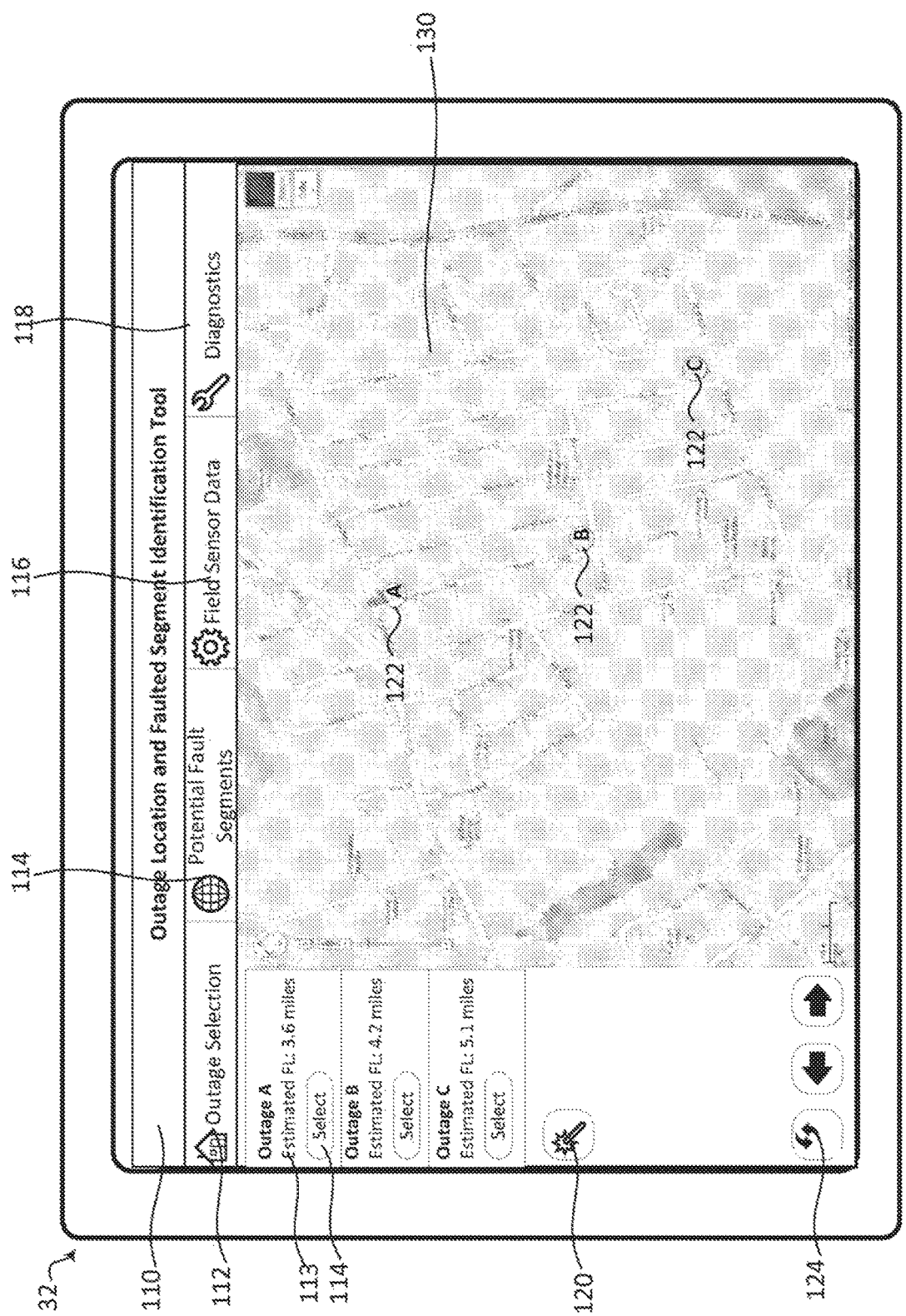
FIG. 7 depicts a screen of a mobile device running an application that provides distance to fault location and power network operational status from the intelligent fuses and other equipment on the power distribution network.

With reference now to FIG. 7, the distance to the fault location 113, labeled as 'Estimated FL,' is calculated by the mobile application using various methods. One method for calculating the distance to the fault location from a measurement point or across measurement points is disclosed in U.S. Pat. No. 5,839,093, the contents of which are incorporated by reference in its entirety herein. In the present disclosure, the characteristic values are measured by the sensors 12 and/or fuses 10 having embedded sensors installed on the power network of interest that are in proximity to the fault location. The characteristic values are transmitted by the communications medium 30 to the mobile device(s) 32 of the utility crew 36 and the mobile application uses the iterative or direct methods disclosed in U.S. Pat. No. 5,839,093 to determine the distance to the fault from the faulted fuse location or other measurement point.

Another method for calculating the distance to fault location from a measurement point or faulted fuse location is by using Ohm's law:

$$d = \hat{v}/I \div Z | \quad (1),$$

where V=voltage during the fault, in Volts; I=current during the fault, in Amperes; Z=line impedance, in ohms/length unit; and d=distance to the fault, in length units, such as miles. It should be appreciated that there are many methods for calculating the distance to a fault based on characteristic values at a measurement point (fuse location) contemplated by the inventors and that the methods provided herein are by way of non-limiting example.

The voltage and current characteristic values are measured by voltage and current sensors 12 located proximate to the faulted fuse or embedded in the fuse assembly, as mentioned above. The characteristic values are transmitted to the mobile device through the communications medium to the mobile device. The distance along the line is determined using the network model distances and/or GPS coordinates of the measured characteristic values.

The mobile device runs a computer application on a computer readable medium to execute instructions to carry out an Ohm's law calculation, the iterative or direct methods disclosed in U.S. Pat. No. 5,839,093, or another distance to fault location calculation. Alternatively, the fuse electronic circuit 16 captures the current and voltage measurements at the measurement point and calculates the distance to the fault location using the Ohm's law calculation, the iterative or direct methods disclosed in U.S. Pat. No. 5,839,093, or another distance to fault location calculation. The results of the calculations derived by the electric circuit 16 are transmitted to receivers such as the mobile devices or another computer, such as the substation or NCC computer for presentation to the user.

The fuse electronic circuit 16 may use any of the previously mentioned triggering methods to transmit the data such as interrogation by any of the aforementioned devices, on a scheduled basis, or upon detection of a fault condition by the fuse 10. With reference to the Ohm's law calculation, when reactive power calculations are made using complex value for voltages, impedances, and currents, the distance to fault estimate should result in a complex number. The real component is an estimate of the distance to fault and the imaginary component should be close to zero.

The implementation of the Ohm's law calculation, as is known by those having ordinary skill in the art, requires that the various fault types are taken into account, such as phase-to-phase, phase-to-ground, and three-phase faults. Each fault type experiences different impedances from the other fault types. For example, fault currents may have offsets or the fault may add impedance.

The most critical input to a fault location algorithm is the impedance data. Therefore, it is important to use the impedances, voltage and currents that correspond to the type of fault. For line-to-ground faults, line-to-ground quantities are used, as follows:

$$V=V_a, I=I_a, Z=Z_S=(2Z_1+Z_0)/3 \qquad (2)$$

For line-to-line faults, line-to-line-to ground faults, or three-phase faults, phase-to-phase quantities are used, as follows:

$$V=V_{ab}, I=I_a-I_b, Z=Z_1. \qquad (3)$$

When the utility crew executes a network operational status app 110 on the mobile device 32, the processor executes computer-readable instructions to determine the distance to the fault location using the voltage and current characteristic values across phase a, b, and c conductors, a single-phase, or line-to-line, as determined by the type of fault, the characteristic values being obtained from the electronic circuit 16. The complex quantities derived using the calculations above are further transformed in a known manner from current and voltage waveforms by the mobile application 110 into complex phasors using a Fourier transform, the results of which are shown in the voltage and current phasor charts 35, 39 of FIG. 3.

With continued reference to FIG. 7, a display screen of the mobile device 32 is shown having the outage location and faulted segment identification tool mobile application 110 running thereon. The mobile application 110 has outage selection, potential fault segments, field sensor data, and diagnostic tabs 112, 114, 116, 118. The mobile application 110 has a settings option that allows the user to configure the user's location profile and display settings.

The mobile application 110 allows for scrolling in each tab and zooming in the map 130 views. The mobile application 110 can be refreshed using the refresh button 124 to update the present outage situation for the location of interest. The refresh button 124, when selected, will update the mobile device 32 screen with new outages since the last refresh and any repaired outages will be removed from the mobile device 32 display.

The outage selection pane 112 allows the user to view fault locations in the utility crew's area of responsibility. The fault locations are listed as outages a, b, and c 122 and correspond to the fault or maintenance locations 122 plotted in the potential fault segments 114 tab. The distances to the fault locations a, b, and c are provided in the outage selection pane 112. The distances to the fault locations are displayed and calculated in relation to the location of the mobile device 32, in relation to other outages, in relation to a blown fuse or fuse of interest, or in relation to measurement points, depending on the settings made in the settings option.

The distances to the fault locations are calculated using the aforementioned equations or other suitable distance to fault calculations. Upon the user selecting the desired outage 113, the mobile application 110 provides directions and navigation from the user's location to the selected fault or maintenance location 122.

Upon selection of the field sensor data tab 116 the user is presented characteristic values measured at the desired location such as pre-fault current, current and voltage waveforms charted over a selected time frame as depicted in FIG. 3, and weather conditions including but not limited to temperature, barometric pressure, and humidity, as received from the sensors at the fuse 10 location. The user may view in the field sensor data tab 116 downed conductor photos or video as captured by the weather sensor.

The diagnostics tab 118 provides a comparison of pre-fault current values with real-time current values and allows the user to update an outage as resolved so that the outage is removed from display in the outage selection pane 112 and potential fault segments view 114. Alternatively, the user may mark the outage as repaired or completed by selecting the outage 113 and then the completion function key 120.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

What is claimed is:

1. A fuse adapted for mounting in a cutout of a power distribution network, said fuse comprising:
    a fuse holder, comprising:
        a fuse element; and
        an electronic circuit, having:
            1) a circuit to condition and digitize analog signals representative of characteristic values of a power network measurement point upon which the cutout is installed to provide characteristic values;
            2) a processor for analyzing said characteristic values and providing output data to a communications interface; and
            3) said communications interface for communicating a location of said fuse element and for transmitting said output data via a communications medium to a receiver so that said output data is used by said receiver to calculate a distance from said fuse element to a fault location in an underground circuit of the power distribution network.

2. The fuse of claim 1, wherein said output data is used to generate voltage and current waveform plots on said receiver.

3. The fuse of claim 1, wherein said receiver is selected from the group consisting of a mobile device, substation computer, NCC computer, and a cloud data repository.

4. The fuse of claim 1, wherein when said fuse operates due to a fault condition at said fault location.

5. The fuse of claim 1, wherein said fuse element is mounted in said fuse holder.

6. The fuse of claim 1, wherein said fuse element connects an overhead circuit to said underground circuit.

7. The fuse of claim 6, wherein said fuse element is operable to disconnect the underground circuit from the overhead circuit in response to a fault at said fault location.

8. The fuse of claim 1, further comprising a current sensor embedded in the fuse holder.

9. The fuse of claim 1, wherein said output data includes voltage and current waveform plots on said receiver.

10. A fuse adapted for mounting in a cutout of a power distribution network, said fuse comprising:
 a fuse holder, comprising:
  a fuse element in said fuse holder, said fuse element located at a measurement point in the power distribution network that connects an overhead circuit to an underground circuit;
  an electronic circuit, configured to:
   measure characteristic values of the power distribution network at said measurement point;
   record said measured characteristic values;
   communicate a location the fuse element to a receiver; and
   communicate said recorded characteristic values to said receiver to calculate a distance from the fuse element to a fault location on the underground circuit in response to a fault in the underground circuit using said recorded characteristic values at said measurement point.

11. The fuse of claim 10, further comprising a current sensor embedded in the fuse holder.

12. The fuse of claim 10, wherein said distance is from said fuse element at said measurement point to said fault location.

* * * * *